US012732576B2

(12) United States Patent
Eom et al.

(10) Patent No.: US 12,732,576 B2
(45) Date of Patent: Sep. 8, 2026

(54) ELECTRONIC DEVICE FOR RECOGNIZING COVER DEVICE AND OPERATION METHOD THEREOF

(71) Applicant: SAMSUNG ELECTRONICS CO., LTD., Suwon-si (KR)

(72) Inventors: Kihun Eom, Suwon-si (KR); Taekeun Kim, Suwon-si (KR); Heesung Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 431 days.

(21) Appl. No.: 18/210,465

(22) Filed: Jun. 15, 2023

(65) Prior Publication Data

US 2023/0328169 A1 Oct. 12, 2023

Related U.S. Application Data

(63) Continuation of application No. PCT/KR2021/018003, filed on Dec. 1, 2021.

(30) Foreign Application Priority Data

Jan. 6, 2021 (KR) ........................ 10-2021-0001604

(51) Int. Cl.
*H04M 1/72454* (2021.01)
*G01R 33/00* (2006.01)
(Continued)

(52) U.S. Cl.
CPC .... *H04M 1/72454* (2021.01); *G01R 33/0029* (2013.01); *H04M 1/026* (2013.01);
(Continued)

(58) Field of Classification Search
CPC .. H04M 1/02; H04M 1/0266; H04M 2250/12; H04M 2250/22; H04M 1/026;
(Continued)

(56) References Cited

U.S. PATENT DOCUMENTS 7,637,024 B2 * 12/2009 Amundson ......... H04M 1/0245 33/355 R
9,547,336 B2 * 1/2017 Lee ....................... G06F 1/1692
(Continued)

FOREIGN PATENT DOCUMENTS

CN 111174807 A 5/2020
JP 2003-166826 A 6/2003
(Continued)

OTHER PUBLICATIONS

Communication dated Jan. 16, 2025, issued by the Korean Intellectual Property Office in Korean Application No. 10-2021-0001604.

(Continued)

*Primary Examiner* — Golam Sorowar
(74) *Attorney, Agent, or Firm* — Sughrue Mion, PLLC

(57) ABSTRACT

An electronic device includes: a magnetic sensor; a communication module; at least one processor operatively connected with the magnetic sensor and the communication module. The at least one processor is configured to: identify that a magnetic signal is detected through the magnetic sensor; identify, based on a magnitude of the detected magnetic signal, whether the magnetic signal is generated by coupling the electronic device with a cover device; and based on identifying that the magnetic signal is generated by coupling the electronic device with the cover device, correct sensor data of the magnetic sensor.

13 Claims, 11 Drawing Sheets

(51) Int. Cl.
*H04M 1/02* (2006.01)
*H04M 1/7246* (2021.01)

(52) U.S. Cl.
CPC ...... *H04M 1/7246* (2021.01); *H04M 2201/34* (2013.01); *H04M 2201/36* (2013.01); *H04M 2250/12* (2013.01)

(58) Field of Classification Search
CPC ......... H04M 1/72412; H04M 1/72454; H04M 1/0277; H04M 1/725; H04M 2250/52; H04M 1/0202; H04M 1/0245; H04M 1/0268; H04M 1/0262; H04M 1/0274; H04M 1/185; H04M 1/67; H04M 1/72403; G06F 3/0488; G06F 3/0416; G06F 21/32; G06F 3/016; G06F 1/1656; G06F 3/04883; G06F 1/1626; G06F 3/0482; G06F 3/017; G06F 3/03545; G06F 3/0412; G06F 2203/04106; G06F 3/0446; G06F 2203/04105
See application file for complete search history.

(56) References Cited

U.S. PATENT DOCUMENTS 9,578,766 B2 * 2/2017 Jin ...................... H04M 1/0245
10,571,973 B2 * 2/2020 Xu ...................... G01R 33/093
10,838,462 B1 * 11/2020 Monaco .................. G06F 1/324
2009/0319222 A1 12/2009 Katayama
2012/0072155 A1 3/2012 Kadokura
2012/0072167 A1 * 3/2012 Cretella, Jr. ............. G06F 9/00 702/150
2013/0328825 A1 * 12/2013 Brown ..................... G01B 7/30 345/174
2014/0298062 A1 * 10/2014 Lee ....................... G06F 1/1626 713/323
2015/0031347 A1 1/2015 Kim et al.
2017/0141806 A1 5/2017 Kuhl et al.
2017/0235339 A1 * 8/2017 Scales .................. G06F 1/1633 361/679.56
2017/0244823 A1 8/2017 Kim et al.

FOREIGN PATENT DOCUMENTS

| | | | |
|---|---|---|---|
| JP | 2008-064662 | A | 3/2008 |
| KR | 10-2005-0035817 | A | 4/2005 |
| KR | 10-2013-0140172 | A | 12/2013 |
| KR | 10-2014-0122602 | A | 10/2014 |
| KR | 10-1480943 | B1 | 1/2015 |
| KR | 10-2015-0013961 | A | 2/2015 |
| KR | 10-2015-0083415 | A | 7/2015 |

OTHER PUBLICATIONS

International Search Report (PCT/ISA/210) issued Mar. 11, 2022 from the International Searching Authority in International Application No. PCT/KR2021/018003.
Written Opinion (PCT/ISA/237) issued Mar. 11, 2022 from the International Searching Authority in International Application No. PCT/KR2021/018003.
Communication issued Sep. 29, 2025 by the Korean Intellectual Property Office in Korean Patent Application No. 10-2021-0001604.

* cited by examiner

ELECTRONIC DEVICE FOR RECOGNIZING COVER DEVICE AND OPERATION METHOD THEREOF

CROSS-REFERENCE TO RELATED APPLICATIONS

This application is a by-pass continuation application of International Application No. PCT/KR2021/018003, filed on Dec. 1, 2021, which is based on and claims priority to Korean Patent Application No. 10-2021-0001604, filed on Jan. 6, 2021, in the Korean Intellectual Property Office, the disclosures of which are incorporated by reference herein their entireties.

BACKGROUND

1. Field

The disclosure relates to an electronic device for recognizing a cover device and an operation method thereof.

2. Description of Relate Art

With the gradual expansion of various services and additional functions provided by an electronic device, a cover device (or a protection cover) manufactured in the same size and shape as the exterior of the electronic device is provided as an accessory for safely protecting the electronic device from an external impact or penetration of foreign substances and expressing a user's individuality. For example, the cover device may cover only the exterior edge of a case or a rear surface of the electronic device. Or, the cover device may be a flip type that covers both front and rear surfaces of the electronic device and covers a display part of the electronic device to be opened or closed only when in use.

The cover device may have various functions, such as a function of turning on/off a display in response to an electronic device as the cover device is opened or closed. Generally, a method of utilizing a magnet and a Hall sensor is used to determine an opening or a closing of the cover device. Thus, the cover device coupled to an electronic device includes a magnet, and the electronic device may determine whether the cover device is opened or closed, by using a Hall sensor.

However, since a Hall sensor for recognizing a cover device is required to be mounted on all electronic devices, although not all users of the electronic devices use a cover device, this may increase development cost of the electronic devices. In addition, when a new sensor, which replaces the Hall sensor, is added to an electronic device, the development cost of the electronic device becomes a problem and a manufacturing process thereof may become more complicated, which may be inefficient.

SUMMARY

Provided is an electronic device for recognizing a cover device and an operation method thereof, which may recognize the cover device by using a sensor disposed in the electronic device and correct an error in a sensing value of the sensor.

According to an aspect of the disclosure, an electronic device includes: a magnetic sensor; a communication module; at least one processor operatively connected with the magnetic sensor and the communication module. The at least one processor is configured to: identify that a magnetic signal is detected through the magnetic sensor; identify, based on a magnitude of the detected magnetic signal, whether the magnetic signal is generated by coupling the electronic device with a cover device; and based on identifying that the magnetic signal is generated by coupling the electronic device with the cover device, correct sensor data of the magnetic sensor.

The at least one processor may be further configured to perform an operation based on the corrected sensor data.

The operation based on the corrected sensor data may include execution of an application based on a position and a posture of the electronic device.

The electronic device may further include a memory configured to store correction data for each of a plurality of magnetic signal ranges. The at least one processor is further configured to: identify a range to which the magnitude of the detected magnetic signal belongs among the plurality of magnetic signal ranges, and correct the sensor data of the magnetic sensor based on correction data corresponding to the identified magnetic signal range.

The at least one processor may be further configured to identify whether the electronic device is coupled with the cover device, based on the magnitude of the detected magnetic signal being greater than or equal to a threshold value.

The at least one processor may be further configured to: receive identification information of the cover device through the communication module; authenticate the cover device, based on the identification information of the cover device received through the communication module; and based on the authentication of the cover device, correct the sensor data of the magnetic sensor by using the correction data corresponding to the identified magnetic signal range.

The electronic device may further include a display. The at least one processor may be further configured to, based on identifying that the magnetic signal is generated by coupling with a cover device, display a screen theme based on identification information of the cover device on the display.

The at least one processor may be further configured to: identify whether the coupling with the cover device is released, through the communication module, based on the magnetic signal less than the threshold value being detected in a state of being coupled with the cover device; and based on identifying that the coupling with the cover device is released, correct the sensor data of the magnetic sensor by using correction data prior to the coupling with the cover device.

The magnetic sensor may be mounted at a position spaced a predetermined distance apart from a position corresponding to a magnet mounted on the cover device.

According to another aspect of the disclosure, a method for recognizing a cover device by an electronic device, the method includes: identifying that a magnetic signal is detected by a magnetic sensor of the electronic device; identifying, based on a magnitude of the detected magnetic signal, whether the detected magnetic signal is generated by coupling with the cover device; and based on identifying that the magnetic signal is generated by coupling with the cover device, correcting sensor data of the magnetic sensor.

The method may further include performing an operation based on the corrected sensor data, The operation may include execution of an application based on a position and a posture of the electronic device.

The correcting the sensor data of the magnetic sensor may include: identifying a range to which the magnitude of the detected magnetic signal belongs among a plurality of magnetic signal ranges; and correcting the sensor data of the magnetic sensor based on correction data corresponding to the identified magnetic signal range.

The method may further include identifying whether the electronic device is coupled with the cover device, based on the magnitude of the detected magnetic signal being greater than or equal to a threshold value. The identifying whether the electronic device is coupled with the cover device may include: receiving identification information of the cover device through a communication module of the electronic device; and authenticating the cover device, based on the received identification information of the cover device.

The correcting the sensor data of the magnetic sensor may include, based on the authentication of the cover device, correcting the sensor data of the magnetic sensor based on the correction data corresponding to the identified magnetic signal range.

The method may further include: identifying that the coupling with the cover device is released, through the communication module, based on a magnetic signal less than the threshold value being detected in a state of being coupled with the cover device; and based identifying that the coupling with the cover device is released, correcting the sensor data of the magnetic sensor by using correction data prior to the coupling with the cover device.

According to one or more embodiments, the development cost of an electronic device may be reduced by removing a Hall sensor from the electronic device and recognizing a cover device by using a sensor which is basically provided.

According to one or more embodiments, when a magnetic sensor of an electronic device is used to recognize a cover device, an error in a sensing value of the magnetic sensor may be corrected and thus performance degradation of the magnetic sensor due to a magnetic material of the cover device may be prevented.

The effects obtainable from the disclosure may not be limited to the above-mentioned effects, and other effects not mentioned may be clearly understood by a person skilled in the art to which the disclosure belongs from the following description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
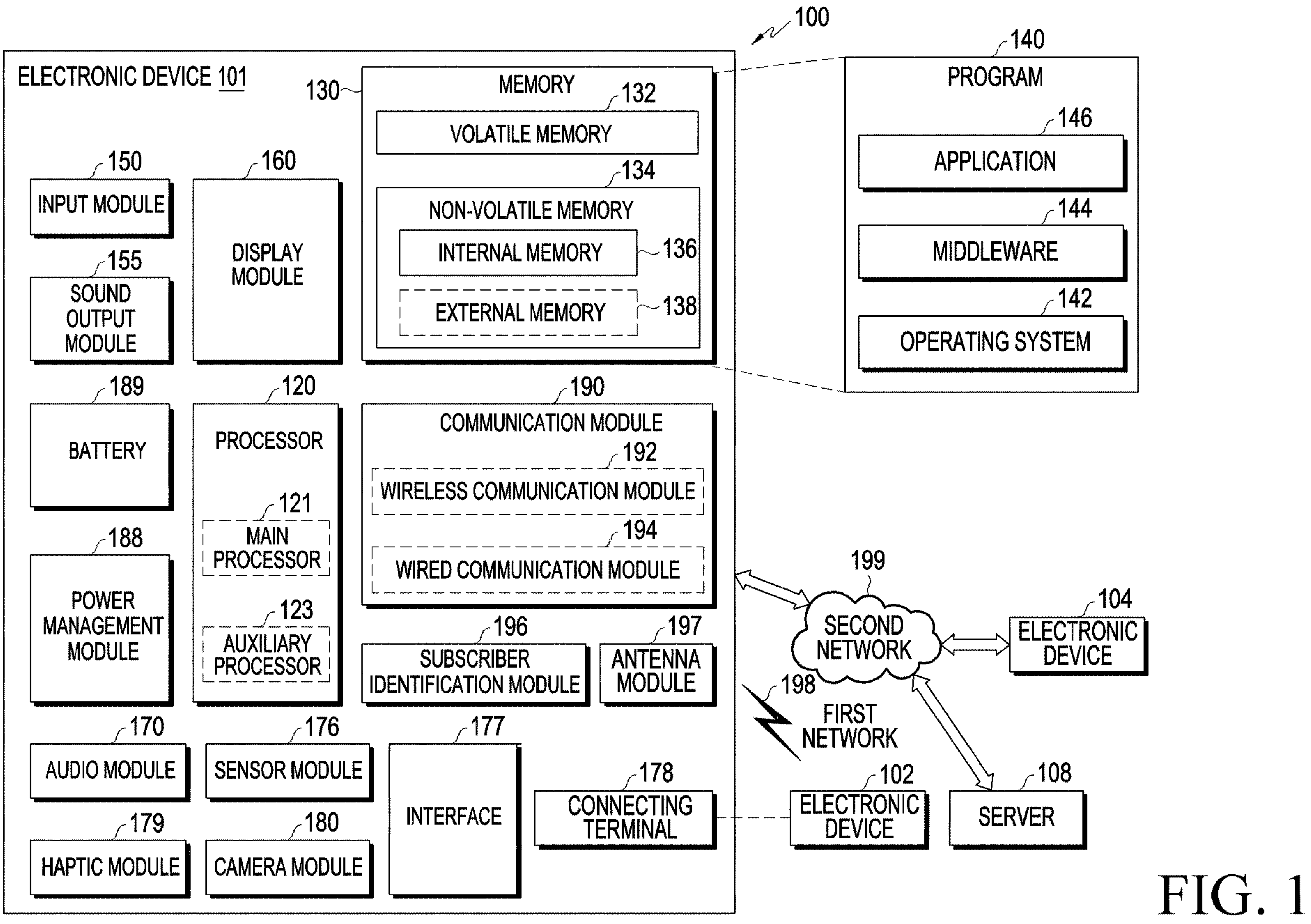
FIG. 1 is a block diagram of an electronic device in a network environment according to one or more embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
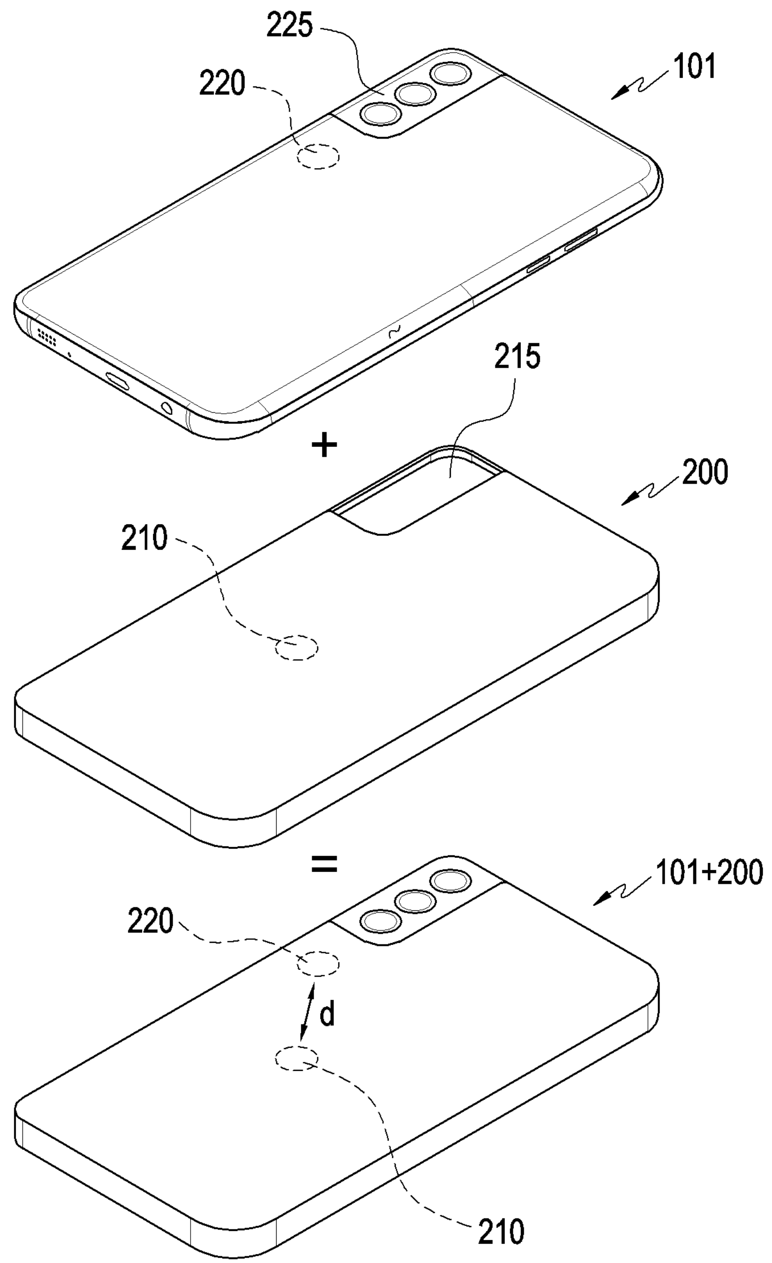
FIG. 2 is a perspective view illustrating a first type in which an electronic device and a cover device are coupled according to one or more embodiments.

FIG. 2 is a perspective view illustrating a first type in which an electronic device and a cover device are coupled according to one or more embodiments.

Referring to FIG. 2, a cover device 200 is detachably provided to the electronic device 101, and may be implemented in the form of, for example, a rear cover device (e.g., a rear cover) coupled to a rear surface of the electronic device 101.

The cover device 200 shown in FIG. 2 covers only the exterior edge of the electronic device 101 or the rear surface of the electronic device 101, and may protect the electronic device 101 from an external environment, and improve functions mounted in the electronic device 101 or provide an additional function to the electronic device 101.

According to an embodiment, the cover device 200 may be in electrical contact with and connected with the electronic device 101, through a detachable coupling with the electronic device.

According to an embodiment, the cover device 200 is detachably provided on the rear surface of the electronic device 101, and when a camera module 225 is provided on the rear surface of the electronic device 101, the cover device may include an opening 215 corresponding to the camera module to provide a photographing route.

According to an embodiment, the cover device 200 may include a magnetic material 210. For example, the magnetic material 210 may include a magnet which may be embedded in the cover device 200 to apply a magnetic signal to the electronic device 101.

According to an embodiment, the electronic device 101 may include a magnetic sensor 220 configured to sense a magnetic signal by the magnetic material 210. For example, the magnetic sensor 220 configured to sense a magnetic signal by the magnetic material 210 may include a magnetic sensor.

According to an embodiment, in the case of an authenticated cover device 200 (e.g., a genuine cover device), since the position of the magnetic material 210 in the cover device 200 is fixed, the electronic device 101 may identify whether the electronic device is coupled with the cover device 200 by using a magnetic signal applied to the magnetic sensor 220 (hereinafter, referred to as a magnetic sensor) of the electronic device 101 by the magnetic material 210. For example, in the case of the authenticated cover device 200, since the magnetic material is disposed at a position determined by an operator during manufacture of the cover device, the electronic device 101 may determine whether the electronic device is coupled with the cover device according to the magnitude of a magnetic signal measured by the magnetic sensor 220. For example, when a magnetic signal having a predetermined size or greater is detected, the electronic device 101 may recognize that a magnetic signal according to the coupling of the cover device 200 is detected. As such, the electronic device 101 may identify whether the electronic device is coupled with the cover device 200 according to the detection of a magnetic signal having a predetermined size or greater, and when whether the electronic device is coupled with the cover device is identified, the electronic device 101 may authenticate the cover device 200 by using a communication module (e.g., the communication module 190 of FIG. 1).

According to an embodiment, the magnetic material 210 may be disposed at a position corresponding to an area where the magnetic sensor 220 configured to recognize the cover device 200 of the electronic device 101 is disposed. According to an embodiment, when the electronic device 101 and the cover device 200 are coupled with each other, the magnetic material 210 of the cover device 200 and the magnetic sensor 220 of the electronic device 101 may be spaced apart from each other to be separately disposed. For example, the magnetic material 210 of the cover device 200 and the magnetic sensor 220 of the electronic device 101 may be spaced apart from each other by a predetermined distance d to be separately disposed.

According to an embodiment, the electronic device 101 may configure the position of the magnetic sensor 220 configured to recognize the cover device 200 so that the maximum intensity of the magnetic material 210 is sensed at a position of about ⅔ of a full scale range of the magnetic sensor 220. For example, when the maximum intensity of the magnetic material 210 of the cover device 200 is about 2000 uT, the magnetic sensor 220 may be disposed at a position where an intensity of about 1500 uT to about 2500 uT may be detected with reference to the maximum intensity of about 2000 uT. Accordingly, as shown in FIG. 2, when the cover device 200 is coupled to the electronic device 101, the magnetic material 210 of the cover device 200 and the magnetic sensor 220 of the electronic device 101 may be spaced apart from each other by a predetermined distance d so that a magnetic signal having an intensity of about 1500 uT to about 2500 uT is applied to the magnetic sensor 220. Therefore, the magnetic sensor 220 may be disposed in a range within a radius d with reference to the magnetic material 210.

Figure 3:
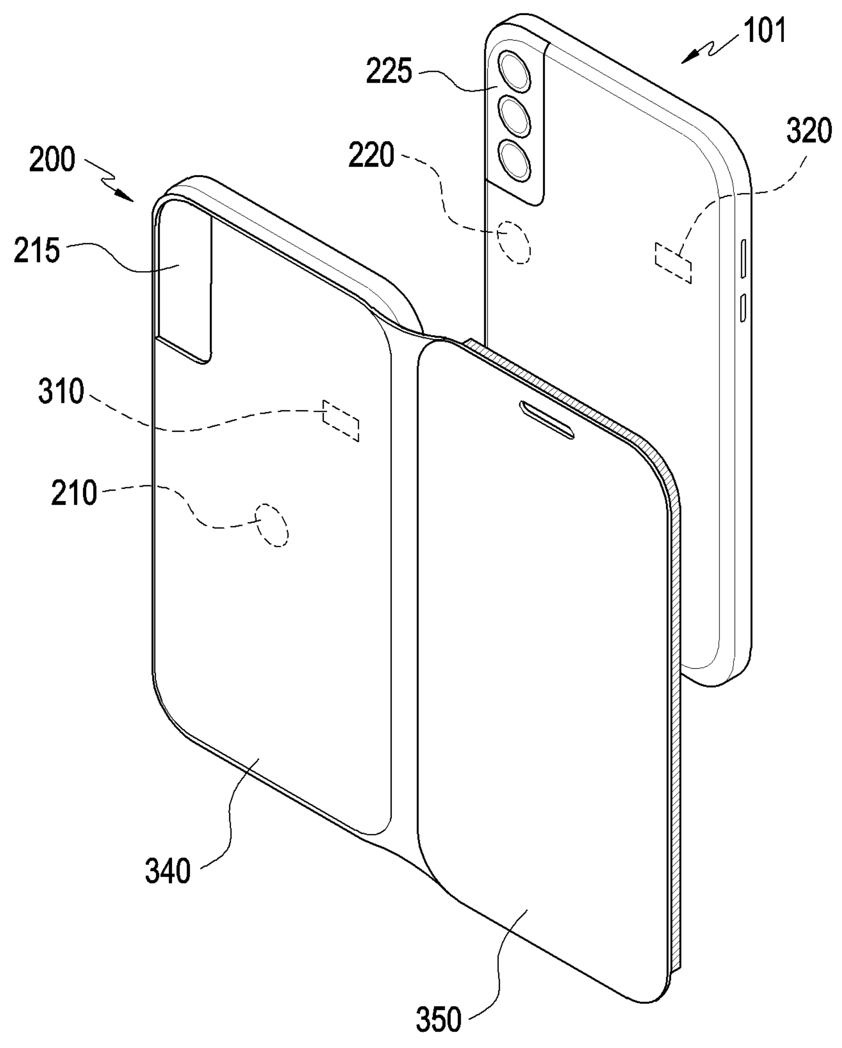
FIG. 3 is a perspective view illustrating a second type in which an electronic device and a cover device are coupled according to one or more embodiments.

FIG. 3 is a perspective view illustrating a second type in which an electronic device and a cover device are coupled according to one or more embodiments.

Referring to FIG. 3, the cover device 200 may be implemented to include, for example, a rear cover device (e.g., a rear cover) 340 coupled to the rear surface of the electronic device 101, and a front cover device (e.g., a front cover) 350 which covers at least a part of a front surface of the electronic device 101.

As shown in FIG. 3, when the cover device 200 is coupled to the electronic device 101 or the front cover of the cover device 200 is covered, a magnetic signal by the magnetic material 210 may be applied to the magnetic sensor 220 disposed in the electronic device 101.

According to an embodiment, the electronic device 101 may identify whether the cover device 200 has been coupled or the cover device is in an open state or a closed state, through the magnetic sensor 220. For example, the magnetic sensor 220 may measure the magnitude (or intensity) of a magnetic signal generated by the magnetic material 210.

According to an embodiment, when the cover device 200 is coupled with the electronic device 101 or the front cover 350 is closed, a magnetic signal greater than or equal to a preconfigured (or predetermined) threshold value may be detected. Therefore, when it is determined that the measured intensity (or magnitude) of the magnetic signal is greater than or equal to the threshold value, the electronic device 101 may determine that the cover device 200 has been coupled or is in a closed state. The threshold value may be a preconfigured reference value in consideration of the characteristics of the magnetic material 210 of the cover device 200 to determine whether the cover device 200 is coupled.

In addition, when the cover device 200 is decoupled from the electronic device 101 or the front cover 350 is opened, the intensity of the magnetic signal may fall below the threshold value. As such, when the intensity of the magnetic signal falls below the threshold value, the electronic device 101 may determine that the coupling of the cover device 200 is released or the cover device is in an open state.

According to an embodiment, in the case of a type (e.g., a flip cover) which, as a flip type, covers both the front and rear surfaces of the electronic device and covers a display part of the electronic device 101 to be opened or closed only when in use, the magnetic sensor 220 and the magnetic material 210 included in the cover device 200 may be positioned within a predetermined range (e.g., a predetermined distance d). For example, in order to determine whether the cover device is coupled, the magnetic material 210 may be disposed on an inner surface of the cover device 200. Alternatively, in order to determine whether the cover device is opened or closed, the magnetic material 210 may be positioned in the front cover of the cover device 200.

According to an embodiment, the cover device 200 may include a communication module 310 configured to identify the cover device. For example, the communication module 310 may include an NFC module. The cover device 200 may provide information related to the cover device 200, for example, identification information to the electronic device 101 through the NFC module. The identification information may include at least one of a type, a product name, an ID, or additional information of the cover device.

According to an embodiment, a communication module 320 may be disposed to be exposed on the rear surface of the electronic device 101 so as to be in contact with and connected with the cover device 200 when the electronic device is coupled with the cover device 200. Correspondingly, the communication module 310 may be disposed to be exposed on the inner surface of the cover device 200.

As described above, according to the type in which the cover device 200 covers the rear surface of the electronic device 101 or the type in which the cover device 200 covers both the front and rear surfaces of the electronic device 101, the position, configuration, or form of the magnetic material 210, the magnetic sensor 220, and each communication module 310 and 320 may be modified or changed, and thus the disclosure may not be limited to the positions shown in FIGS. 2 and 3.

Figure 4:
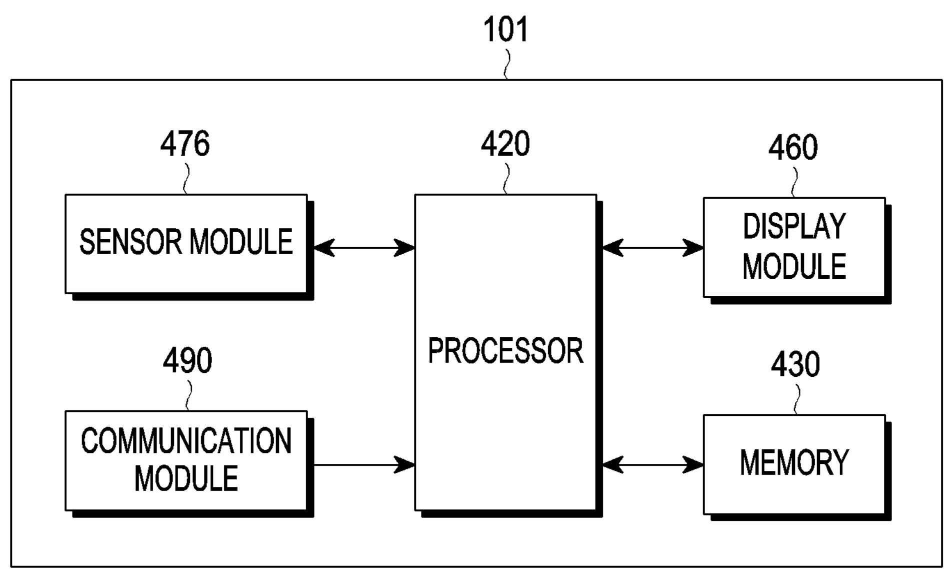
FIG. 4 is an internal block configuration diagram of an electronic device according to one or more embodiments.

FIG. 4 is an internal block diagram of an electronic device according to one or more embodiments. The electronic device 101 of FIG. 4 may include components identical to or similar to those of the electronic device 101 of FIG. 1.

For example, referring to FIG. 4, the electronic device 101 may include a processor 420, a memory 430, a display module 460, a sensor module 476, and/or a communication module 490.

According to an embodiment, the processor 420 may use the sensor module 476 including at least one sensor to detect whether the cover device 200 is coupled (or attached or detached). The sensor module 476 may generate a signal corresponding to whether the cover device 200 is coupled, and transmit the signal to the processor 420.

According to an embodiment, the sensor module 476 may measure the intensity of a magnetic signal generated by the magnetic material 210, and the sensor module 476 may include, for example, a magnetic sensor as a sensor for recognizing coupling of the cover device 200.

The magnetic sensor may be used to estimate the position of the electronic device 101, and when a magnetic material exists around the electronic device 101, the magnetic material may affect a measurement value of the magnetic sensor which measures a magnetic signal, and cause an error.

Therefore, when the cover device 200 including the magnetic material 210 is coupled to the electronic device 101, the measurement value of the magnetic sensor may be affected by the magnetic material 210, and thus, according to an embodiment, in a state of being coupled with the cover device 200, the processor 420 may perform a correction operation to reduce an error in sensor data (or a sensor value) of the magnetic sensor. For example, in a state of being coupled with the cover device 200, the correction operation may be continuously or periodically performed, and the correction operation may be performed at any time point when the magnetic sensor is used, such as when an application using the magnetic sensor is executed or after the application is executed.

The processor 420 may detect a magnetic signal by using the magnetic sensor, and the detected magnetic signal may not be caused by the magnetic material of the cover device 200 but may be caused by a surrounding magnetic material. Therefore, the processor may determine whether the detected magnetic signal is caused by the magnetic material 210 of the cover device 200. The magnetic signal may be generated by the magnetic material 210 but may also be generated by a surrounding magnetic field, and may be replaced with a term such as a magnetic field or a magnetic force.

Therefore, in order to determine whether the detected magnetic signal is a magnetic signal generated by the magnetic material 210 of the cover device 200, the processor 420 may identify whether a magnetic signal having a predetermined intensity or greater is detected, through the magnetic sensor. In order to determine whether the detected magnetic signal is a magnetic signal generated by the magnetic material 210, the predetermined intensity, that is, a threshold value may be previously determined in consideration of the characteristics of the magnetic material 210 of the cover device 200. For example, since the specification of the magnetic material 210 mounted on the cover device 200 is determined at the time of development, a threshold value considering the specification may also be previously determined.

The processor 420 may detect the intensity (or magnitude) of a magnetic signal through the magnetic sensor, and when a magnetic signal greater than or equal to a threshold value is detected, it may be considered as being due to coupling of the cover device 200. However, even when the magnetic signal greater than or equal to the threshold value is detected, it may be necessary to identify whether the detected magnetic signal is a magnetic signal by the magnetic material 210 of the actual cover device 200.

To this end, the processor 420 may authenticate the cover device 200.

According to an embodiment, the processor 420 may activate the communication module 490, for example, an NFC module when a magnetic signal having an intensity greater than or equal to a threshold value is detected. In addition, the cover device 200 may also include a communication module configured to communicate with the electronic device 101, for example, an NFC module.

According to an embodiment, the processor 420 may receive identification information of the cover device 200 through the communication module 490.

According to an embodiment, the processor 420 may identify the type of the cover device, based on the identification information of the cover device 200 received from the cover device 200 through the communication module 490. For example, when the identification information indicating that the identified cover device is a flip cover is received, the processor 420 may execute an operation to use a flip cover-type cover device.

According to an embodiment, the processor 420 may retrieve a user interface environment based on the identification information of the cover device 200 from a memory, and configure the same. For example, at least one area of a display of the electronic device 101 may be activated based on the identification information. In addition, when the cover device 200 is a flip cover, the electronic device 101 may identify whether the cover device is coupled, by using the magnetic sensor, and may identify whether the cover device 200 is opened or closed, by using a proximity sensor.

According to an embodiment, when the authentication of the cover device 200 based on the identification information of the cover device 200 is completed, the processor 420 may identify that the detected magnetic signal is caused by the magnetic material 210 of the cover device 200. Accordingly, the processor 420 may identify that a magnetic signal greater than or equal to a threshold value is a magnetic signal generated according to coupling with the actual cover device 200, and thus may perform an operation of correcting an error of the magnetic sensor.

According to an embodiment, the processor 420 may correct sensor data (or a sensor value) of the magnetic sensor by using correction data corresponding to the magnitude (or intensity) of the detected magnetic signal.

According to an embodiment, when the coupling is released in a state of being coupled with the cover device 200, the influence due to the magnetic material 210 of the cover device 200 also disappears, and thus the sensor data of the magnetic sensor may no longer need to be corrected. When a magnetic signal less than a threshold value is detected in a state of being coupled with the cover device 200, it may indicate that the intensity of the magnetic signal falls below the threshold value as the cover device 200 is separated from the electronic device 101.

According to an embodiment, when a magnetic signal less than a threshold value is detected in a state of being coupled with the cover device 200, the processor 420 may consider that the coupling with the cover device 200 is released, and determine whether the cover device is actually released, through the communication module 490, for example, the NFC module. When there is no information received even through the NFC module, the processor 420 may determine that the coupling with the cover device 200 is released.

According to an embodiment, when the release of the coupling with the cover device 200 is identified, the processor 420 may correct the sensor data of the magnetic sensor by using correction data prior to the coupling with the cover device 200. For example, when the processor 420 has corrected the sensor data of the magnetic sensor even in a basic state in which the cover device 200 is not coupled, the processor may correct the sensor data of the magnetic sensor by using correction data applied in the basic state in which the cover device is not coupled, that is, original correction data. For example, in the case of the magnetic sensor, distortion occurs in a magnetic field according to an arrangement structure in the electronic device 101, and this distortion may cause an error in an azimuth. Therefore, since distortion may occur even in the state in which the cover device is not coupled, the processor 420 may correct the sensor data of the magnetic sensor by using correction data determined in response to the basic state in which the cover device is not coupled.

Alternatively, when there is no need to perform correction in the basic state in which the cover device 200 is not coupled, and thus actual correction is not performed, the processor 420 may not perform a correction operation for the sensor data of the magnetic sensor. Accordingly, when the coupling is released, sensor data may be output in the form of original sensor data of the magnetic sensor which has not been corrected, that is, raw data.

According to an embodiment, the correction data for the correction may be previously stored in the memory 430 in the form of a table. For example, the memory 430 may store a table in which a different piece of correction data is mapped for each of a plurality of magnetic signal ranges. A magnetic signal range may be a reference range for determining correction data (or a correction coefficient) to be applied to a measured magnetic signal to perform correction. A detailed description of such a table will be described later in Table 1.

According to an embodiment, the processor 420 may identify a range to which the magnitude of the detected magnetic signal belongs among the plurality of magnetic signal ranges, and retrieve correction data corresponding to the identified magnetic signal range from the memory 430 and apply the correction data when sensor data is corrected. For example, since an error of the magnetic sensor may be different depending on the degree of being affected by a magnetic material, correction data for restoring to an original value as much as a generated error may be differently determined according to a measurement value of the magnetic sensor. That is, the intensity of a measured magnetic signal may be different according to the type of the magnetic material.

As described above, the processor 420 may correct sensor data of the magnetic sensor by applying correction data corresponding to a range of a magnetic signal defined in the table to sensor data (e.g., raw data) of the magnetic sensor, and calculate an azimuth by using the corrected sensor data.

According to an embodiment, the display module 460 may display an operation execution screen using sensor data corrected by the processor 420. For example, the processor 420 may correct an error in sensor data of the magnetic sensor by using correction data when an application such as a navigation application or a map application is executed or while the application is executed, and display an application execution screen based on the corrected sensor data.

According to one or more embodiments, the electronic device 101 may include a magnetic sensor, the communication module 490, and at least one processor 420 operatively connected to the magnetic sensor and the communication module 490, and the at least one processor 420 is configured to identify whether a magnetic signal detected through the magnetic sensor exists, identify, based on the magnitude of the detected magnetic signal, whether the detected magnetic signal is a magnetic signal generated according to coupling with the cover device 200, and in response to the magnitude of the detected magnetic signal indicating a magnetic signal generated according to coupling with the cover device, correct sensor data of the magnetic sensor.

According to one or more embodiments, the at least one processor 420 may be configured to perform an operation based on the corrected sensor data.

According to one or more embodiments, the operation based on the corrected sensor data may include an application execution operation for execution of an application based on a position and a posture of the electronic device.

According to one or more embodiments, the electronic device 101 may further include the memory 430 configured to store correction data for each of a plurality of magnetic signal ranges, and the at least one processor 420 may be configured to identify a range to which the magnitude of the detected magnetic signal belongs among the plurality of magnetic signal ranges, and correct the sensor data of the magnetic sensor by using correction data corresponding to the identified magnetic signal range.

According to one or more embodiments, the at least one processor 420 may be configured to identify whether the electronic device is coupled with the cover device when the magnitude of the detected magnetic signal is greater than or equal to a threshold value.

According to one or more embodiments, the at least one processor 420 may be configured to receive identification information of the cover device through the communication module, and authenticate the cover device, based on the identification information of the cover device received through the communication module.

According to one or more embodiments, the at least one processor 420 may be configured to, when the authentication of the cover device 200 is completed, correct the sensor data of the magnetic sensor by using the correction data corresponding to the identified magnetic signal range.

According to one or more embodiments, the electronic device 101 may further include a display module 460, and the at least one processor 420 may be configured to, when the coupling with the cover device is identified, display a screen theme based on the identification information of the cover device on the display.

According to one or more embodiments, the at least one processor 420 may be configured to identify whether the coupling with the cover device is released, through the communication module, when a magnetic signal less than the threshold value is detected in a state of being coupled with the cover device.

According to one or more embodiments, the at least one processor 420 may be configured to, when the release of the coupling with the cover device is identified, correct the sensor data of the magnetic sensor by using correction data prior to the coupling with the cover device.

According to one or more embodiments, the magnetic sensor may be mounted at a position spaced a predetermined distance apart from a position corresponding to a magnet mounted on the cover device.

Figure 5:
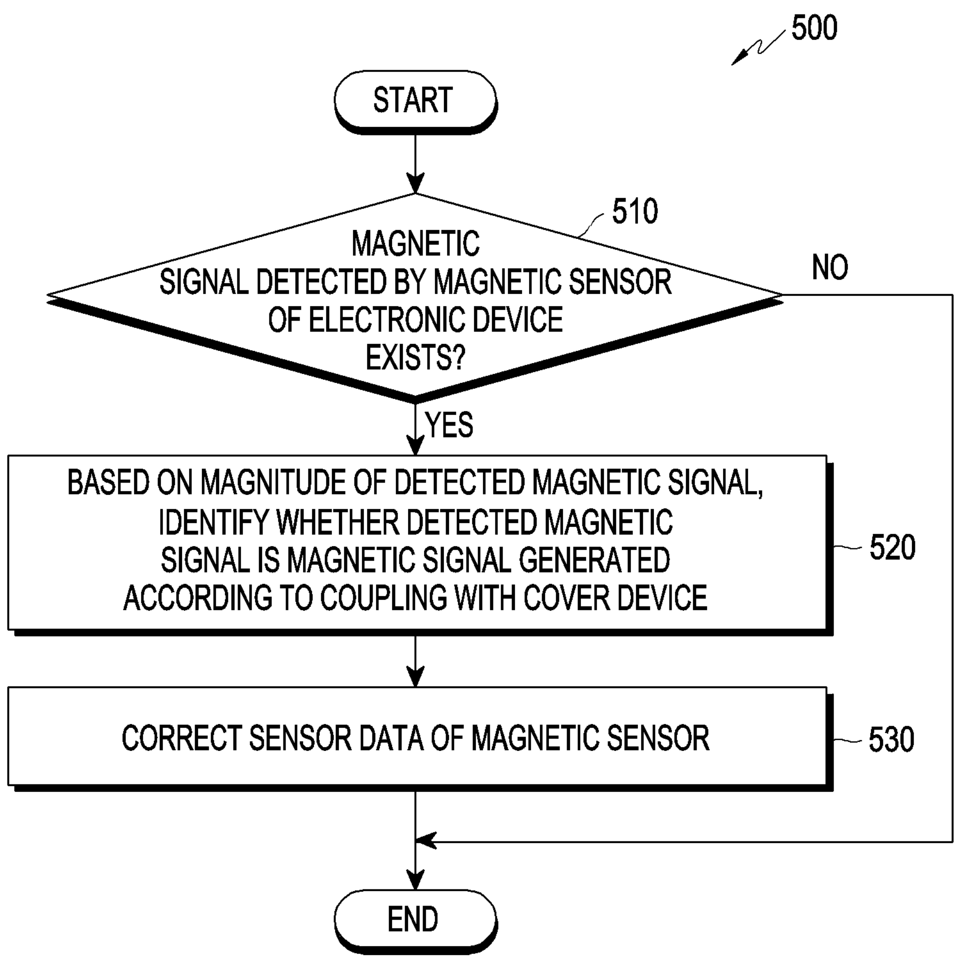
FIG. 5 is a flowchart illustrating an operation for correcting sensor data by an electronic device when the electronic device is coupled with a cover device according to one or more embodiments.

FIG. 5 is a flowchart 500 illustrating an operation for correcting sensor data by an electronic device when the electronic device is coupled with a cover device according to one or more embodiments.

Referring to FIG. 5, an operation method may include operations 510 to 530. Each operation of the operation method of FIG. 5 may be performed by at least one of an electronic device (e.g., the electronic device 101 of FIG. 1 and the electronic device 101 of FIG. 4) and at least one processor (e.g., the processor 120 of FIG. 1 and the processor 420 of FIG. 4) of the electronic device. In an embodiment, at least one of operations 510 to 530 may be omitted, the sequence of some of the operations may be changed, or another operation may be added.

Referring to FIG. 5, in operation 510, the electronic device 101 may identify whether a magnetic signal detected by a magnetic sensor of the electronic device 101 exists. According to an embodiment, when a user couples the cover device 200 including the magnetic material 210 to the electronic device 101, the magnetic sensor may detect a magnetic signal generated by the magnetic material 210.

In response to the detection of the magnetic signal from the magnetic sensor, in operation 520, the electronic device 101 may identify whether the detected magnetic signal is a magnetic signal generated according to the coupling with the cover device 200, based on the magnitude of the detected magnetic signal. According to an embodiment, the electronic device 101 may compare the magnitude of the detected magnetic signal with a threshold value to identify whether the electronic device is coupled with the cover device 200. For example, when the magnitude of the detected magnetic signal is greater than or equal to the threshold value, the electronic device 101 may recognize the detected magnetic signal as a magnetic signal generated by the coupling with the cover device 200. When it is identified that the cover device 200 is coupled with electronic device, the electronic device may authenticate the cover device 200 by using the communication module 490 (e.g., an NFC module).

According to an embodiment, the identifying of whether the electronic device is coupled with the cover device 200 may include receiving identification information of the cover device 200 through the communication module 490 of the electronic device 101, and authenticating the cover device 200, based on the received identification information of the cover device 200.

In response to the magnitude of the detected magnetic signal indicating a magnetic signal generated according to the coupling with the cover device 200, in operation 530, the electronic device 101 may correct sensor data of the magnetic sensor.

According to an embodiment, the correcting of the sensor data of the magnetic sensor may include, when the authentication of the cover device is completed, correcting the sensor data of the magnetic sensor by using correction data corresponding to the identified magnetic signal range.

According to an embodiment, the correcting of the sensor data of the magnetic sensor may include identifying a range to which the magnitude of the detected magnetic signal belongs among a plurality of magnetic signal ranges, and correcting the sensor data of the magnetic sensor by using the correction data corresponding to the identified magnetic signal range.

For example, when the position of the electronic device 101 is estimated using the magnetic sensor and the cover device 200 is coupled at a time point of executing a position-based application, an error in sensor data (or a sensor value) measured by the magnetic sensor may occur due to the influence of the magnetic material 210 of the cover device 200. Since such an error is an error due to the characteristic of the magnetic material 210 generated due to the coupling with the cover device 200, if the error due to the characteristics of the magnetic material 210 is corrected for a measurement value of the magnetic sensor, the electronic device 101 may obtain a more accurate sensor measurement value. Accordingly, the electronic device 101 may provide a more accurate position of the electronic device 101 in a position-based application using the corrected sensor data.

According to an embodiment, a method for correcting sensor data may include performing an operation based on the corrected sensor data. For example, the operation based on the corrected sensor data may include an application execution operation for execution of an application based on a position and a posture of the electronic device.

When the coupling with the cover device 200 is released, correction may be performed differently from when the cover device 200 is coupled. According to one or more embodiments, the method for correcting the sensor data may further include identifying whether the coupling with the cover device is released, through the communication module, when a magnetic signal less than the threshold value is detected in a state of being coupled with the cover device 200.

According to one or more embodiments, the method for correcting the sensor data may further include correcting the sensor data of the magnetic sensor by using correction data prior to the coupling with the cover device 200 when the release of the coupling with the cover device 200 is identified.

Figure 6:
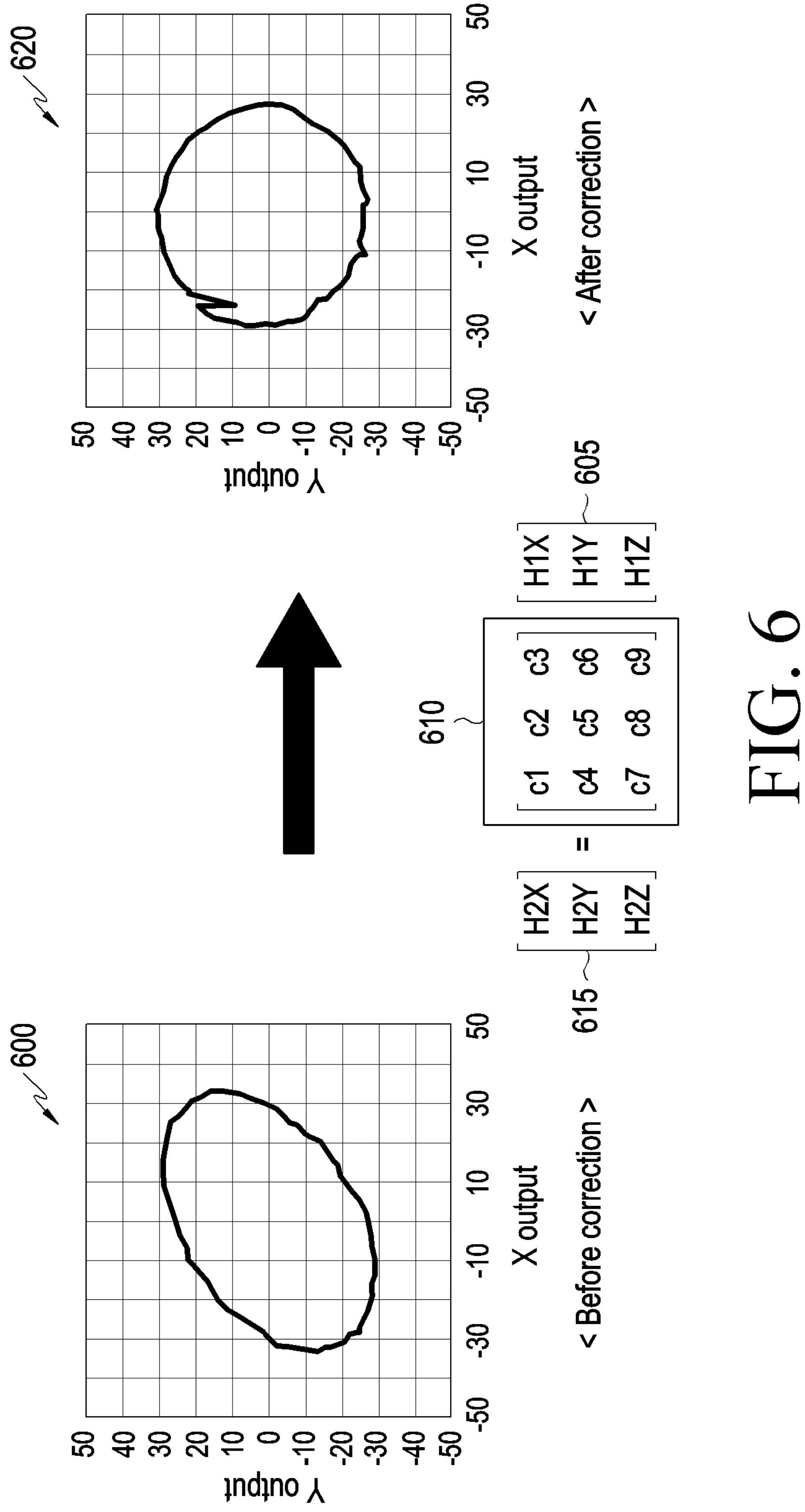
FIG. 6 is a diagram illustrating an example of sensor data before/after correction according to one or more embodiments.

FIG. 6 is a diagram illustrating an example of sensor data before/after correction according to one or more embodiments.

Referring to FIG. 6, a magnetic sensor may measure an earth's magnetic field in three axes x, y, and z, and measure each magnetic signal with respect to the three axes. In this case, an error may occur in a measurement value of the magnetic sensor not only due to an arrangement structure in the electronic device 101 but also due to the influence of a magnetic material. Therefore, the accuracy may be increased by correcting such an error by using a correction coefficient.

Referring to FIG. 6, when raw data output from the magnetic sensor while rotating the electronic device 101 in one direction is represented as a graph, the raw data may be output in a non-circular shape (e.g., an ellipse shape) as indicated by a reference numeral 600. The non-circular shape may correspond to sensor data of the magnetic sensor before correction.

Such the non-circular shape may mean distortion of the sensor data, which causes an error in an azimuth. Therefore, when the electronic device 101 multiplies sensor data 605 of the magnetic sensor by a correction coefficient 610 to remove the distortion, corrected sensor data 615 may be obtained. Accordingly, when the corrected sensor data 615 is represented as a graph, the data may be output as a circle as indicated by a reference numeral 620. The correction coefficient 610 may be a 3×3 vector value. As such, when the corrected sensor data displayed in the form of a circle graph is used, an azimuth error may be reduced, and thus the electronic device 101 may provide a more accurate position. In this case, in order to determine a correction coefficient (or correction data) to be applied to the sensor data 605 of the magnetic sensor to perform correction, the intensity of a magnetic signal measured by the magnetic sensor, that is, the magnitude of a magnetic signal generated by the magnetic material may be used, and a detailed description thereof will be described with reference to FIG. 7.

Figure 7:
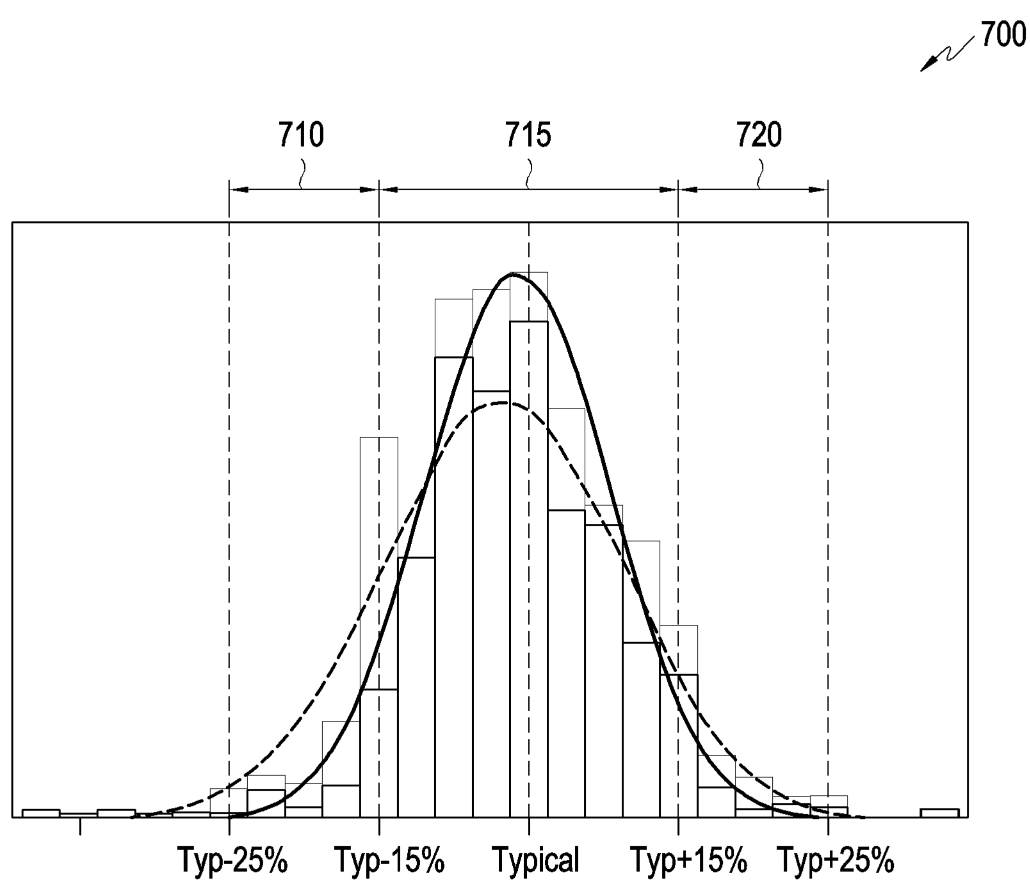
FIG. 7 is a diagram illustrating an example of a magnetic signal distribution according to one or more embodiments.

FIG. 7 is a diagram illustrating an example of a magnetic signal distribution according to one or more embodiments.

FIG. 7 illustrates a distribution 700 of magnetic signals generated by a magnetic material, which may indicate the degree to which the magnetic material affects.

According to an embodiment, the electronic device 101 may previously store a plurality of correction coefficients to correct a magnetic sensor. For example, in the electronic device 101, with reference to an offset of a magnetic signal measured through the magnetic sensor when the electronic device is coupled with the cover device 200, a correction coefficient corresponding thereto may be made in the form of a table through pre-measurement. Each correction coefficient may be determined via an experiment in a stage of developing the electronic device 101.

According to an embodiment, a different piece of correction data may be applied to each intensity range of a magnetic signal. As shown in FIG. 7, each range may be largely distinguished with reference to "typical" which is a peak of the intensity of a magnetic signal of a magnetic material. For example, a first range 710 may be determined as a section from about −25% to about −15% with reference to the peak, a second range 715 may be determined as a section from about −15% to about +15% with reference to the peak, and a third range 720 may be determined as a section from about +15% to about +25% with reference to the peak. For example, when the intensity of a magnetic signal measured by the magnetic sensor with reference to the peak is less than about −25% or exceeds about +25%, the electronic device 101 may ignore the magnetic signal by considering that the magnetic signal is not a magnetic signal caused by the magnetic material. Therefore, when a magnetic signal corresponding to about −25% or greater with reference to the peak of the magnetic signal of the magnetic material is detected, the electronic device 101 may authenticate the cover device 200 to determine whether the detected magnetic signal is a magnetic signal due to coupling of the actual cover device 200.

As shown in FIG. 7, when the intensity of a magnetic signal measured by the magnetic sensor falls within one of the first range 710 to the third range 720, the electronic device 101 may retrieve and apply correction data of a corresponding range among correction data previously mapped for each range during correction of sensor data. In this case, when the intensity of a magnetic signal measured by the magnetic sensor is out of the first range 710 to the third range 720, for example, when the intensity of the magnetic signal is less than about −25% or exceeds about +25%, the electronic device may be in a state of not being coupled with the cover device 200. Therefore, the electronic device 101 may correct the sensor data by using original correction data corresponding to the state of not being coupled with the cover device 200. Table 1 may be referred to examine a relationship with correction data corresponding to each of the ranges (the first range 710, the second range 715, and the third range 720).

Table 1 illustrates an example of a table of a plurality of magnetic signal ranges according to one or more embodiments.

TABLE 1

| | Definition | Correction data |
|---|---|---|
| First magnetic signal range | State in which cover device is not coupled | First correction data |
| Second magnetic signal range | Minimum magnetic signal range of cover device (e.g., peak −25% to peak −15%) | Second correction data |
| Third magnetic signal range | Peak magnetic signal range of cover device (e.g., peak −15% to peak +15%) | Third correction data |
| Fourth magnetic signal range | Maximum magnetic signal range of cover device (e.g., peak +15% to peak +25%) | Fourth correction data |

Table 1 illustrates a table in which correction data for each of the plurality of magnetic signal ranges is mapped. Referring to Table 1, the electronic device 101 may store data for correction of sensor data of the magnetic sensor in the memory 430. Table 1 illustrates four types of correction data for correction of the magnetic sensor. The correction data may be a correction coefficient applied to the sensor data of the magnetic sensor.

According to an embodiment, correction data may be different for each of a first magnetic signal range to a fourth magnetic signal range, and each correction data may be determined via an experiment with reference to an offset of a magnetic signal measured through the magnetic sensor when the cover device 200 is coupled to the electronic device 101.

For example, each of the magnetic signal ranges may be determined in consideration of various characteristics of the magnetic material, such as the type of the magnetic material and a distance from the magnetic material. For example, one magnetic signal range may be determined as a range allowing an error within a predetermined range with reference to the intensity of a measured magnetic signal.

For example, when the intensity of a magnetic signal detected through the magnetic sensor falls within a second magnetic signal range, the electronic device 101 may correct the sensor data of the magnetic sensor by applying second correction data corresponding to the second magnetic signal range. As such, the electronic device 101 may correct the sensor data of the magnetic sensor by using a correction coefficient corresponding to the intensity of the detected magnetic signal. Accordingly, the electronic device may correct an error due to coupling with the cover device 200 and thus provide more accurate sensor data.

As shown in Table 1, the first magnetic signal range may indicate a state in which the cover device 200 is not coupled, and in the state in which the cover device 200 is not coupled, the electronic device 101 may perform correction by using first correction data.

The second magnetic signal range may be a minimum (min) magnetic signal range of the cover device 200, that is, a range determined according to a minimum magnetic signal intensity of the magnetic material, and may be determined as, for example, a section (e.g., the first range 710 of FIG. 7) from about −25% to about −15% with reference to the peak. The electronic device 101 may perform correction by using the second correction data when the intensity of the detected magnetic signal of the magnetic sensor falls within the second magnetic signal range.

A third magnetic signal range may be a peak magnetic signal range of the cover device 200, that is, a range determined according to a peak magnetic signal intensity of the magnetic material, and may be determined as, for example, a section (e.g., the second range 715 of FIG. 7) from about −15% to about +15% with reference to the peak. The electronic device 101 may perform correction by using third correction data when the intensity of the detected magnetic signal of the magnetic sensor falls within the third magnetic signal range.

The fourth magnetic signal range may be a maximum magnetic signal range of the cover device 200, that is, a range determined according to a maximum magnetic signal intensity of the magnetic material, and may be determined as, for example, a section (e.g., the third range 720 of FIG. 7) from about +15% to about +25% with reference to the peak. The electronic device 101 may perform correction by using fourth correction data when the intensity of the detected magnetic signal of the magnetic sensor falls within the fourth magnetic signal range.

For example, when it is assumed that the magnitude of a magnetic signal which can be generated by a magnetic material to which the minimum magnetic signal intensity is applied is about 1000 uT, a threshold value for determining whether the cover device 200 in the second magnetic signal range is coupled may be determined to be about 1000 uT. When it is assumed that the magnitude of a magnetic signal which can be generated by a magnetic material to which the peak magnetic signal intensity is applied is about 2000 uT, a threshold value in the third magnetic signal range may be determined to be about 2000 uT. In addition, when it is assumed that the magnitude of a magnetic signal which can be generated by a magnetic material to which the maximum magnetic signal intensity is applied is about 3000 uT, a threshold value in the fourth magnetic signal range may be determined to be about 3000 uT.

Figure 8:
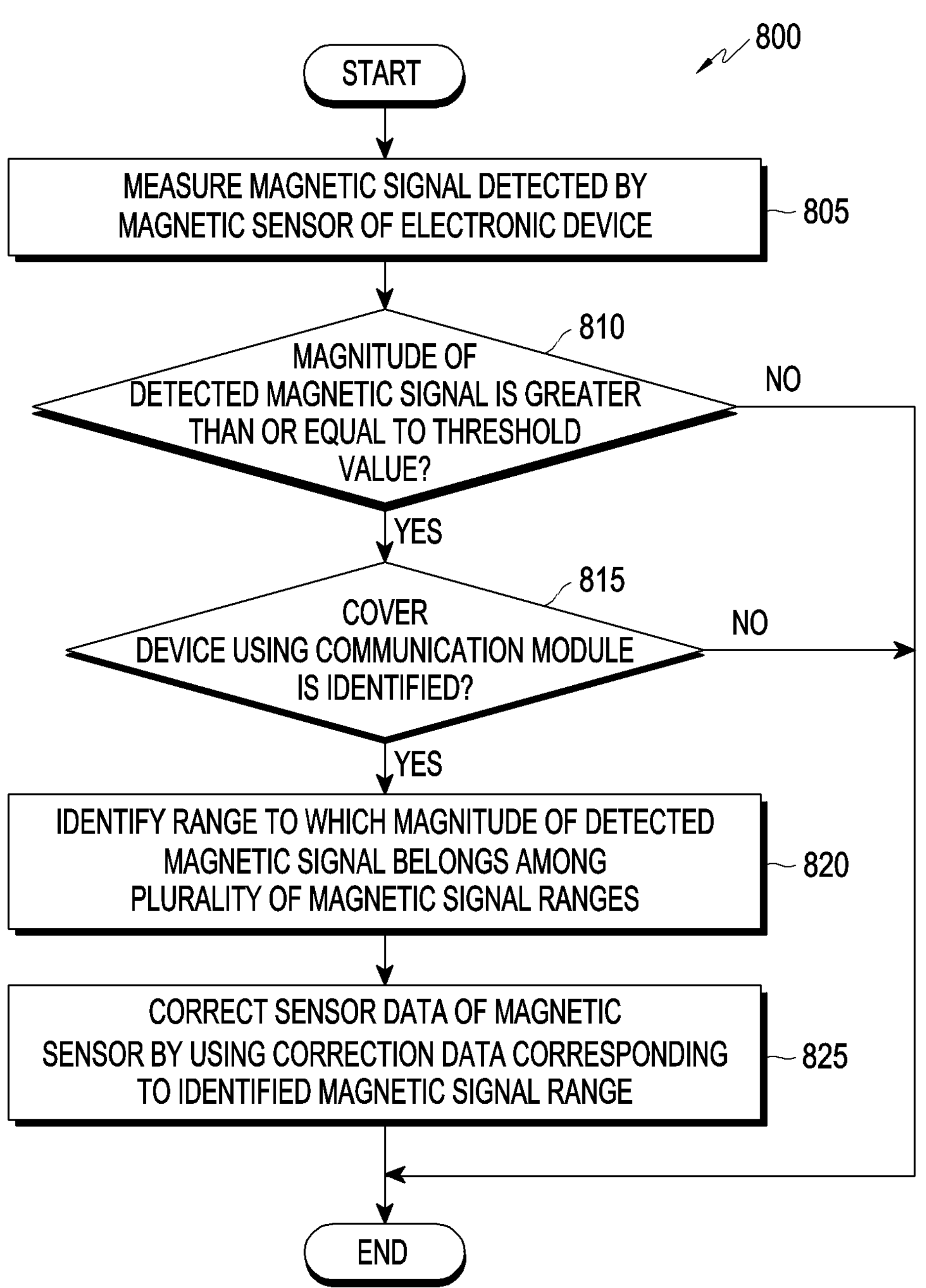
FIG. 8 is a flowchart illustrating a detailed operation for correcting sensor data by an electronic device when the electronic device is coupled with a cover device according to one or more embodiments.

FIG. 8 is a flowchart 800 illustrating a detailed operation for correcting sensor data by an electronic device when the electronic device is coupled with a cover device according to one or more embodiments.

Each operation of an operation method of FIG. 8 may be performed by at least one of an electronic device (e.g., the electronic device 101 of FIG. 1 and the electronic device 101 of FIG. 4) and at least one processor (e.g., the processor 120 of FIG. 1 and the processor 420 of FIG. 4) of the electronic device. In an embodiment, at least one of operations 805 to 825 may be omitted, the sequence of some of the operations may be changed, or another operation may be added.

Referring to FIG. 8, in operation 805, the electronic device 101 may measure a magnetic signal detected by a magnetic sensor of the electronic device 101. In operation 810, the electronic device 101 may identify whether the magnitude of the detected magnetic signal is greater than or equal to a threshold value.

When the magnitude of the detected magnetic signal is greater than or equal to the threshold value, in operation 815, the electronic device 101 may determine whether the cover device 200 using a communication module (e.g., an NFC module) is identified. For example, the electronic device 101 may authenticate the cover device, based on identification information of the cover device 200 received through the NFC module.

When the cover device 200 is identified, in operation 820, the electronic device 101 may identify a range to which the magnitude of the detected magnetic signal belongs among a plurality of magnetic signal ranges. Correspondingly, in operation 825, the electronic device 101 may correct sensor data of the magnetic sensor by using correction data corresponding to the identified magnetic signal range.

Figure 9:
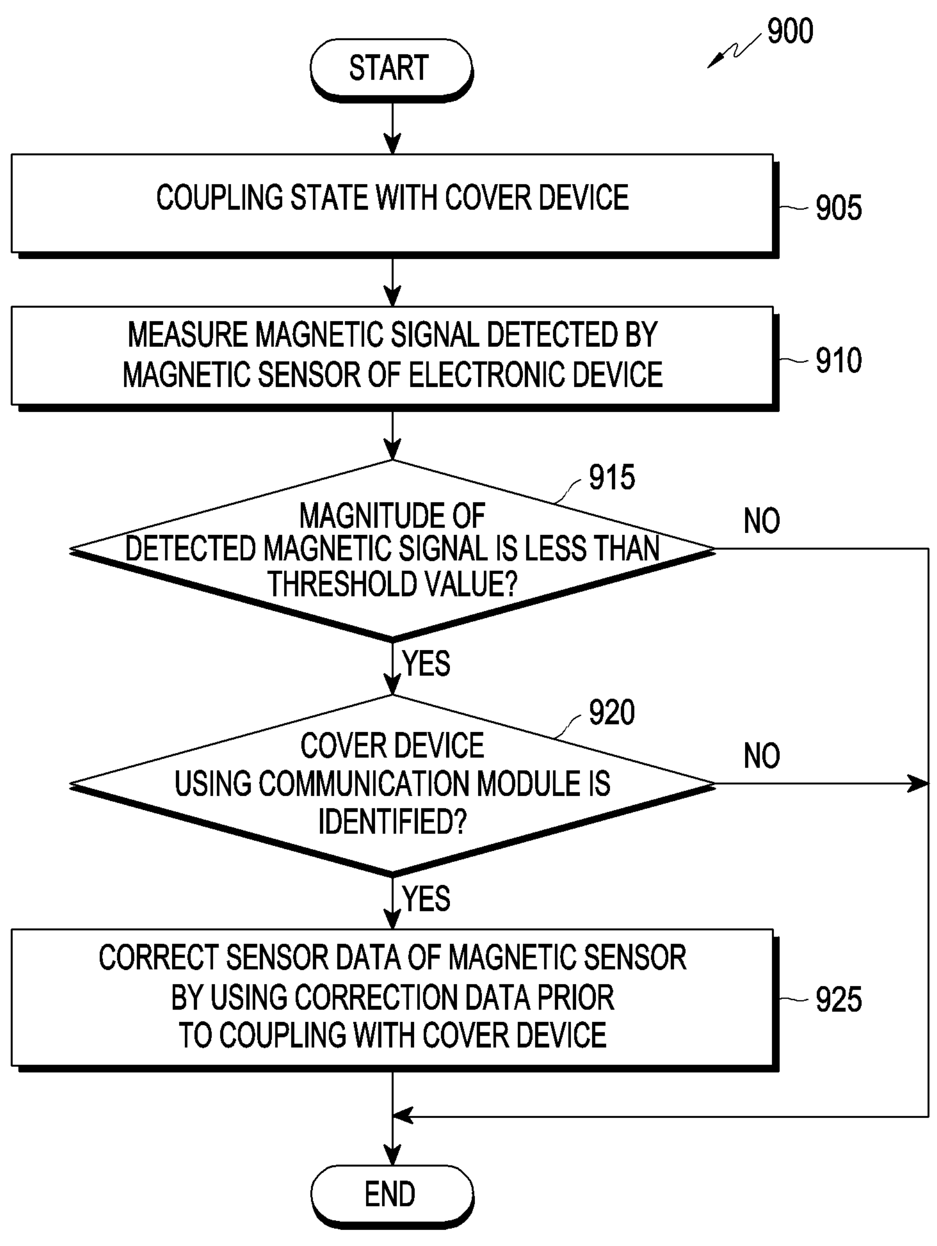
FIG. 9 is a flowchart illustrating a detailed operation for correcting sensor data by an electronic device when coupling with a cover device is released according to one or more embodiments.

FIG. 9 is a flowchart 900 illustrating a detailed operation for correcting sensor data by an electronic device when coupling with a cover device is released according to one or more embodiments. According to an embodiment, FIG. 9 may be an operation flowchart following FIG. 8. In an embodiment, at least one of operations 905 to 925 may be omitted, the sequence of some of the operations may be changed, or another operation may be added. For example, although it is described in FIG. 9 that operation 920 of identifying a cover device using a communication module is performed after operation 915, when the magnitude of a detected magnetic signal is less than a threshold value, operation 925 may be performed directly without the need to perform an operation of identifying the cover device, and accordingly, operation 920 may be omitted.

In FIG. 9, it may be assumed that the electronic device 101 is in a state of being coupled with the cover device 200. Therefore, FIG. 9 illustrates an operation when coupling with the cover device 200 is released, that is, the cover device 200 is separated from the electronic device 101.

Referring to FIG. 9, in operation 910, the electronic device 101 may measure a magnetic signal detected by a magnetic sensor of the electronic device 101 in a state of being coupled with the cover device 200 in operation 905. In operation 915, the electronic device 101 may identify whether the magnitude of the detected magnetic signal is less than a threshold value. For example, when a user separates the cover device 200 from the electronic device 101, the influence due to the magnetic material 210 of the cover device 200 may also be eliminated. Therefore, release of coupling of the cover device 200 may be identified by identifying whether the magnitude of a magnetic signal falls below the threshold value.

When the magnitude of the detected magnetic signal is less than the threshold value, in operation 920, the electronic device 101 may determine whether the cover device 200 using the communication module 490 is identified. When whether the cover device 200 is coupled is identified using the communication module 490, in operation 925, the electronic device 101 may correct sensor data of the magnetic sensor by using correction data prior to the coupling with the cover device 200.

Figure 10:
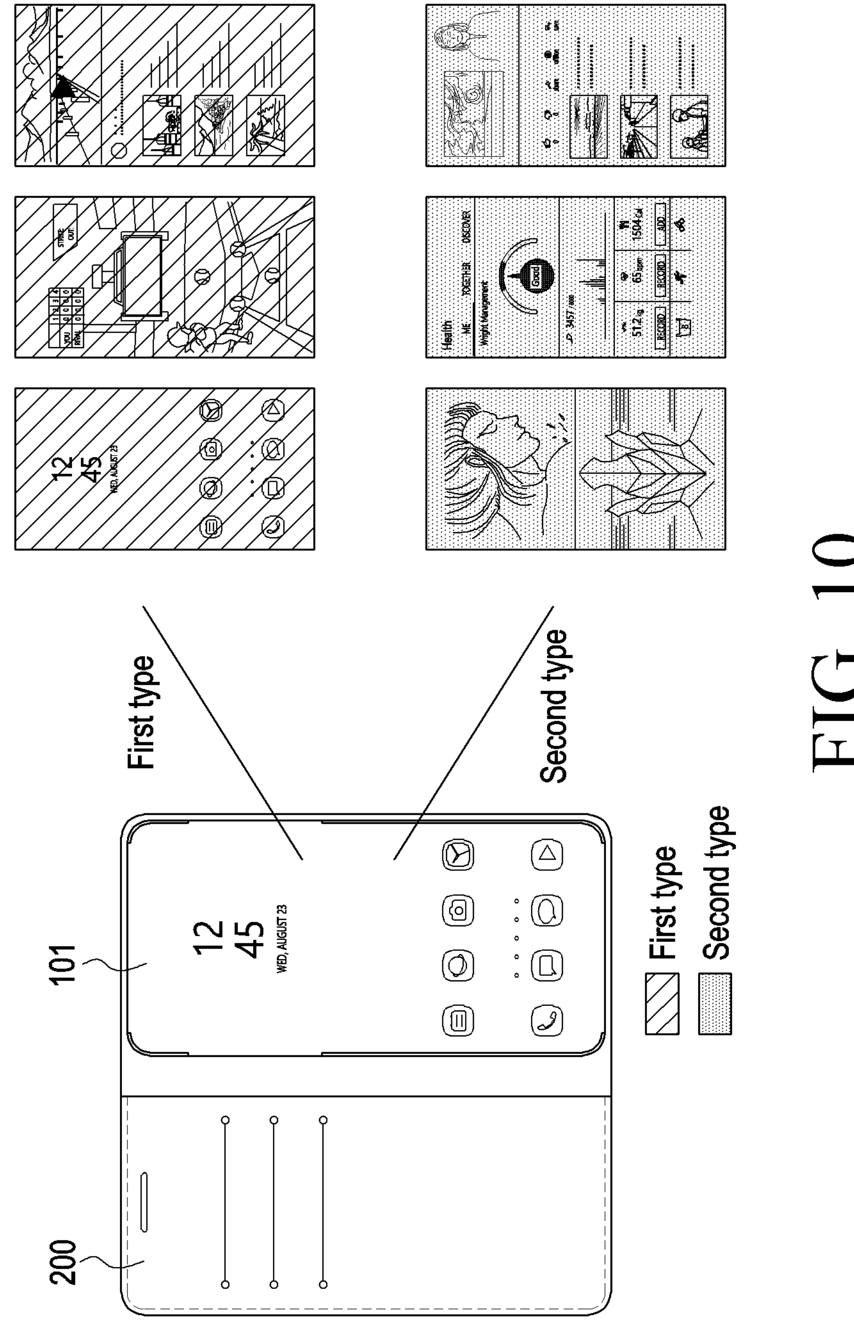
FIG. 10 is a diagram illustrating an example of an operation screen of an electronic device corresponding to coupling with a cover device according to one or more embodiments.

FIG. 10 is a diagram 1000 illustrating an example of an operation screen of an electronic device corresponding to coupling with a cover device according to one or more embodiments.

FIG. 10 illustrates an operation of the electronic device 101 based on identification information of the cover device 200 provided from the cover device 200 through a communication module (e.g., an NFC module) when the electronic device 101 is coupled with the cover device 200.

Based on the identification information of the cover device 200 as shown in FIG. 10, the electronic device 101 may display a screen theme corresponding to a first type in the case of the first type, and display a screen theme corresponding to a second type in case of the second type.

When the cover device 200 is mounted on the electronic device 101, the electronic device 101 may recognize whether the cover device is coupled through a magnetic sensor, and recognize whether the cover device 200 is genuine and a specific theme of a cover, through the NFC module. According to an embodiment, the electronic device 101 may automatically download and install a theme suitable for the cover device 200 on a screen of the electronic device 101 according to a cover recognition result. For example, when the type of the cover device 200 is recognized as a red cover device, based on the identification information of the cover device 200, the electronic device 101 may display a plurality of selectable screen themes corresponding to a recognition result of the red cover. Therefore, a user can view various selectable themes only by inserting the cover device 200 into the electronic device 101, and a desired theme may be downloaded and automatically installed according to a user selection.

Figure 11:
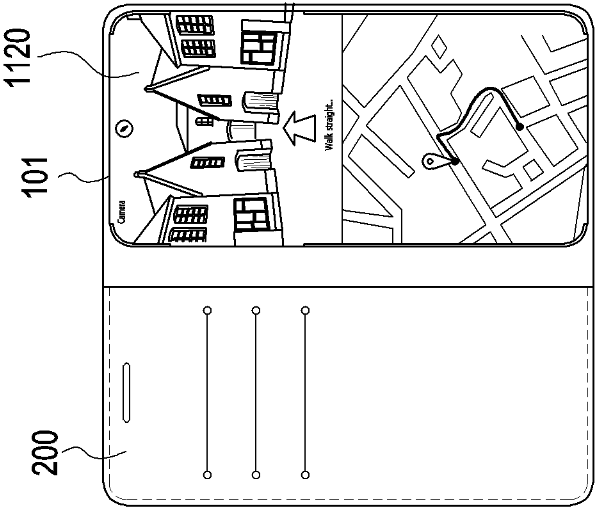
FIG. 11 is a diagram illustrating an example of an application execution screen based on corrected sensor data according to one or more embodiments.
Figure 11:
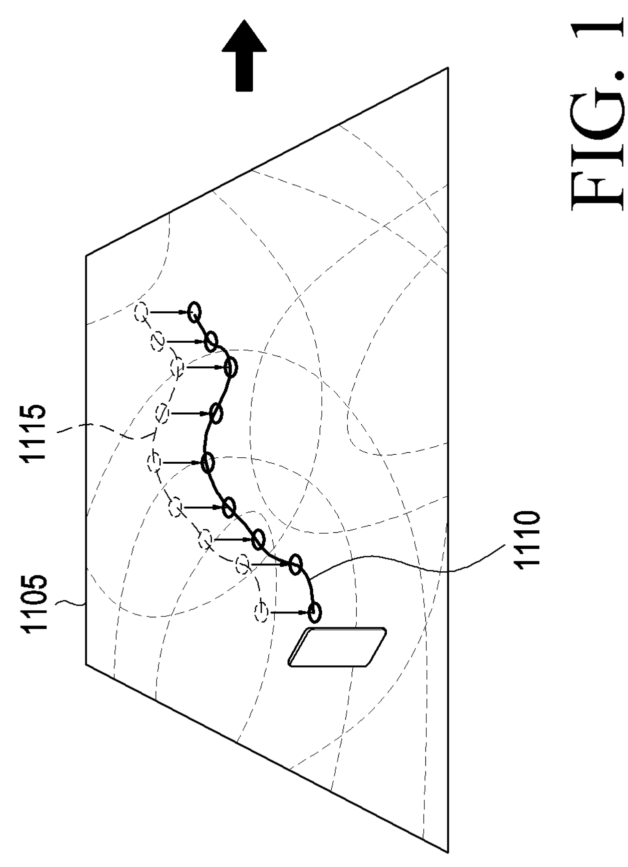

FIG. 11 is a diagram illustrating an example of an application execution screen based on corrected sensor data according to one or more embodiments.

Referring to FIG. 11, the electronic device 101 may be able to execute various applications based on corrected sensor data.

According to an embodiment, a magnetic sensor may be used in various applications according to purposes. For example, in the case of an application such as a navigation application or a map application, an error in sensor data may occur due to a magnetic signal generated by a magnetic material of the cover device 200 within a predetermined area where the electronic device 101 moves. Therefore, the electronic device 101 may provide information on an accurate posture or a current position by correcting an error in sensor data of the magnetic sensor by using correction data when an application is executed or during execution of an application.

For example, as shown in FIG. 11, when a navigation application is being executed, a navigation screen 1120 based on corrected sensor data of the magnetic sensor may be output through the display module 460. For example, when the detachable cover device 200 is coupled to the electronic device 101, interference regarding the sensor data of the magnetic sensor occurs due to the magnetic material of the cover device 200, and thus sensor data corresponding to coordinates different from actual ones may be output.

Therefore, the electronic device 101 may detect the magnitude of a magnetic signal by the magnetic material of the cover device 200, and correct sensor data of the magnetic sensor by using correction data corresponding to the detected magnitude of the magnetic signal among pre-stored correction data. For example, the electronic device 101 may obtain sensor data on an actual position of the electronic device 101 by applying a correction vector to sensor data in x, y, and z axes.

As described above, an actual moving position and a corrected position may be different due to the influence of the magnetic material of the cover device 200, and the electronic device 101 can provide a more accurate route via correction. For example, route data (or trajectory) 1115 according to the movement of the electronic device 101 on a map 1105 may be modified 1110 via correction, and accordingly, the electronic device 101 may reconfigure and display a current position on the navigation screen 1120 by using the corrected sensor data.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term “non-transitory” simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer’s server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
a magnetic sensor;
communication circuitry;
at least one processor operatively connected with the magnetic sensor and the communication circuitry; and
memory storing instructions that, when executed by the at least one processor individually or collectively, cause the electronic device to:
identify that a magnetic signal is detected through the magnetic sensor;
identify, based on a magnitude of the detected magnetic signal, whether the magnetic signal is generated by coupling the electronic device with a cover device; and
in response to the magnitude of the detected magnetic signal being indicated as the magnetic signal generated by coupling the electronic device with the cover device, correct sensor data of the magnetic sensor using correction data corresponding to the magnitude of the detected magnetic signal,
wherein the memory further stores correction data for each of a plurality of magnetic signal ranges, and
wherein the instructions, when executed by the at least one processor individually or collectively, cause the electronic device to correct the sensor data of the magnetic sensor by:
identifying a magnetic signal range corresponding to the magnitude of the detected magnetic signal among the plurality of magnetic signal ranges, and
correcting the sensor data of the magnetic sensor based on correction data corresponding to the identified magnetic signal range.

2. The electronic device of claim 1, wherein the instructions, when executed by the at least one processor individually or collectively, cause the electronic device to perform an operation based on the corrected sensor data.

3. The electronic device of claim 2, wherein the operation based on the corrected sensor data comprises execution of an application based on a position and a posture of the electronic device.

4. The electronic device of claim 1, wherein the instructions, when executed by the at least one processor individually or collectively, cause the electronic device to identify whether the electronic device is coupled with the cover device, based on the magnitude of the detected magnetic signal being greater than or equal to a threshold value.

5. The electronic device of claim 4, wherein the instructions, when executed by the at least one processor individually or collectively, cause the electronic device to:
receive identification information of the cover device through the communication circuitry;
authenticate the cover device, based on the identification information of the cover device received through the communication circuitry; and
based on the authentication of the cover device, correct the sensor data of the magnetic sensor by using the correction data corresponding to the identified magnetic signal range.

6. The electronic device of claim 1, further comprising a display,
wherein the instructions, when executed by the at least one processor individually or collectively, cause the electronic device to, based on identifying that the magnetic signal is generated by coupling the electronic device with the cover device, display a screen theme based on identification information of the cover device on the display.

7. The electronic device of claim 5, wherein the instructions, when executed by the at least one processor individually or collectively, cause the electronic device to:
identify whether the coupling of the electronic device with the cover device is released, through the communication circuitry, based on the magnitude of the magnetic signal less than the threshold value being detected in a state of being coupled with the cover device; and
based on identifying that the coupling with the cover device is released, correct the sensor data of the magnetic sensor by using correction data prior to the coupling with the cover device.

8. The electronic device of claim 1, wherein the magnetic sensor is mounted at a position spaced a predetermined distance apart from a position corresponding to a magnet mounted on the cover device.

9. A method for recognizing a cover device by an electronic device, the method comprising:

identifying that a magnetic signal is detected by a magnetic sensor of the electronic device;

identifying, based on a magnitude of the detected magnetic signal, whether the detected magnetic signal is generated by coupling the electronic device with the cover device; and in response to the magnitude of the detected magnetic signal being indicated as the magnetic signal generated by coupling the electronic device with the cover device, correcting sensor data of the magnetic sensor using correction data corresponding to the magnitude of the detected magnetic signal, wherein the correcting the sensor data of the magnetic sensor comprises:

identifying a magnetic signal range corresponding to the magnitude of the detected magnetic signal among a plurality of magnetic signal ranges; and correcting the sensor data of the magnetic sensor based on correction data corresponding to the identified magnetic signal range.

10. The method of claim 9, further comprising performing an operation based on the corrected sensor data, wherein the operation comprises execution of an application based on a position and a posture of the electronic device.

11. The method of claim 9, further comprising identifying whether the electronic device is coupled with the cover device, based on the magnitude of the detected magnetic signal being greater than or equal to a threshold value, wherein the identifying whether the electronic device is coupled with the cover device comprises:

receiving identification information of the cover device through communication circuitry of the electronic device; and authenticating the cover device, based on the received identification information of the cover device.

12. The method of claim 11, wherein the correcting the sensor data of the magnetic sensor comprises, based on the authentication of the cover device, correcting the sensor data of the magnetic sensor based on the correction data corresponding to the identified magnetic signal range.

13. The method of claim 11, further comprising:

identifying that the coupling of the electronic device with the cover device is released, through the communication circuitry, based on the magnetic signal less than the threshold value being detected in a state of being coupled with the cover device; and based on identifying that the coupling with the cover device is released, correcting the sensor data of the magnetic sensor by using correction data prior to the coupling with the cover device.

* * * * *